United States Patent
Park et al.

(10) Patent No.: US 10,608,314 B2
(45) Date of Patent: Mar. 31, 2020

(54) CONNECTION MEMBER AND ELECTRONIC DEVICE INCLUDING THE SAME

(71) Applicant: Samsung Electronics Co., Ltd., Gyeonggi-do (KR)

(72) Inventors: Sung Won Park, Gyeonggi-do (KR); Sun Young Kim, Gyeonggi-do (KR); Seung Yup Lee, Gyeonggi-do (KR)

(73) Assignee: Samsung Electronics Co., Ltd (KR)

( * ) Notice: Subject to any disclaimer, the term of this patent is extended or adjusted under 35 U.S.C. 154(b) by 422 days.

(21) Appl. No.: 15/454,537

(22) Filed: Mar. 9, 2017

(65) Prior Publication Data

US 2017/0263998 A1    Sep. 14, 2017

(30) Foreign Application Priority Data

Mar. 10, 2016    (KR) .......................... 10-2016-0029144

(51) Int. Cl.
*H01Q 1/12* (2006.01)
*H05K 7/14* (2006.01)
*H01Q 1/50* (2006.01)

(52) U.S. Cl.
CPC ................ *H01Q 1/12* (2013.01); *H01Q 1/50* (2013.01); *H05K 7/1427* (2013.01)

(58) Field of Classification Search
USPC ........................................................ 361/748
See application file for complete search history.

(56) References Cited

U.S. PATENT DOCUMENTS

| | | | |
|---|---|---|---|
| 2003/0179055 A1* | 9/2003 | Sweeney ................. | H01P 1/047 333/246 |
| 2015/0123857 A1* | 5/2015 | Park ....................... | H01Q 1/243 343/702 |
| 2015/0155090 A1* | 6/2015 | Burnett ............... | H01F 27/2804 336/200 |
| 2017/0005464 A1 | 1/2017 | Hwang et al. | |

FOREIGN PATENT DOCUMENTS

KR    1020140122950    10/2014
KR    101585604    1/2016

* cited by examiner

*Primary Examiner* — Andargie M Aychillhum
(74) *Attorney, Agent, or Firm* — The Farrell Law Firm, P.C.

(57) ABSTRACT

An electronic device is provided. The electronic device includes a circuit board, a first conductive member electrically connected to the circuit board at a first point, a second conductive member electrically connected to the circuit board at a second point, and a connection member connecting the first conductive member and the second conductive member, where the connection member includes a first conductive layer electrically connected to the first conductive member, a second conductive layer electrically connected to the second conductive member, and a dielectric layer disposed between the first conductive layer and the second conductive layer.

16 Claims, 15 Drawing Sheets

| No | BEFORE Capacitance | AFTER Capacitance | RATE OF CHANGE |
|---|---|---|---|
| 1 | 46 | 46 | 0% |
| 2 | 47 | 47 | 0% |
| 3 | 47 | 47 | 0% |
| 4 | 46 | 45 | -2.2% |
| 5 | 47 | 46 | -2.2% |
| 6 | 47 | 46 | -2.2% |
| 7 | 47 | 47 | 0% |
| 8 | 46 | 45 | -2.2% |
| 9 | 47 | 47 | 0% |
| 10 | 47 | 47 | 0% |

FIG.8

CONNECTION MEMBER AND ELECTRONIC DEVICE INCLUDING THE SAME

PRIORITY

This application claims priority under 35 U.S.C. § 119(a) to a Korean Patent Application filed on Mar. 10, 2016, in the Korean Intellectual Property Office and assigned Serial No. 10-2016-0029144, the entire disclosure of which is incorporated herein by reference.

BACKGROUND

1. Field of the Disclosure

The present disclosure relates generally to a connection member that may be mounted on an electronic device.

2. Description of the Related Art

A portable electronic device, such as a smartphone or a tablet personal computer (PC), may not only support various functions based on an application installed in the electronic device, but also may perform data communication through a wired/wireless network.

Generally, a rear cover and a bezel that define the external appearance of an electronic device are formed of metal. Consumers generally prefer the rear cover and the bezel to be formed of metal due to the unique gloss and the high durability of the metal.

However, when the rear cover and the bezel of the electronic device are formed of metal, electric currents may flow through the metal due to the conductivity of the metal. For example, electrostatic discharges (ESDs) generated on a surface of the rear cover of the electronic device may be delivered to a circuit board along a certain electrical path. The ESDs may influence a precise circuit element provided on the circuit board and, thus, may shorten the life span of the circuit element or may deteriorate or damage the circuit element.

Further, when electric power is supplied from a charger to the electronic device, some leakage currents may flow on the metal rear cover of the electronic device. Accordingly, when the user contacts the rear cover of the electronic device that is being charged, the leakage currents may cause an electric shock to the user and may injure the user.

SUMMARY

The present disclosure has been made to address at least the above-mentioned problems and/or disadvantages and to provide at least the advantages described below.

Accordingly, an aspect of the present disclosure is to provide a connection member, having a specific capacitance component that connects a metal bracket and a metal housing of an electronic device.

Accordingly, another aspect of the present disclosure is to provide a connection member, having a specific capacitance component, that connects a circuit board and a conductive member of an electronic device.

Accordingly, another aspect of the present disclosure is to provide a connection member disposed between a first conductive member and a second conductive member, or between a conductive member and a circuit board to interrupt a signal of a specific frequency or lower due to the frequency characteristics thereof, causing electrostatic discharges introduced from the outside or currents leaked to the outside to be interrupted. Accordingly, when the conductive member or the circuit board is connected to a ground, the electrostatic discharges or leaked currents may be guided to the ground to be discharged.

Accordingly, another aspect of the present disclosure is to provide a connection member having a simple structure to ensure low manufacturing costs.

In accordance with an aspect of the present disclosure, an electronic device is provided. The electronic device includes a circuit board, a first conductive member electrically connected to the circuit board at a first point, a second conductive member electrically connected to the circuit board at a second point, and a connection member connecting the first conductive member and the second conductive member, where the connection member includes a first conductive layer electrically connected to the first conductive member, a second conductive layer electrically connected to the second conductive member, and a dielectric layer disposed between the first conductive layer and the second conductive layer.

In accordance with another aspect of the present disclosure, an electronic device is provided. The electronic device includes a circuit board, a conductive member, and a connection member connecting the circuit board and the conductive member, where the connection member includes a first conductive layer electrically connected to the circuit board, a second conductive layer electrically connected to the conductive member, and a dielectric layer disposed between the first conductive layer and the second conductive layer.

BRIEF DESCRIPTION OF THE DRAWINGS

The above and other aspects, features, and advantages of the present disclosure will be more apparent from the following description taken in conjunction with the accompanying drawings, in which:

FIG. 8 is a table of rates of change in capacitance due to ESDs of connection members, according to an embodiment of the present disclosure;

Figure 1A:
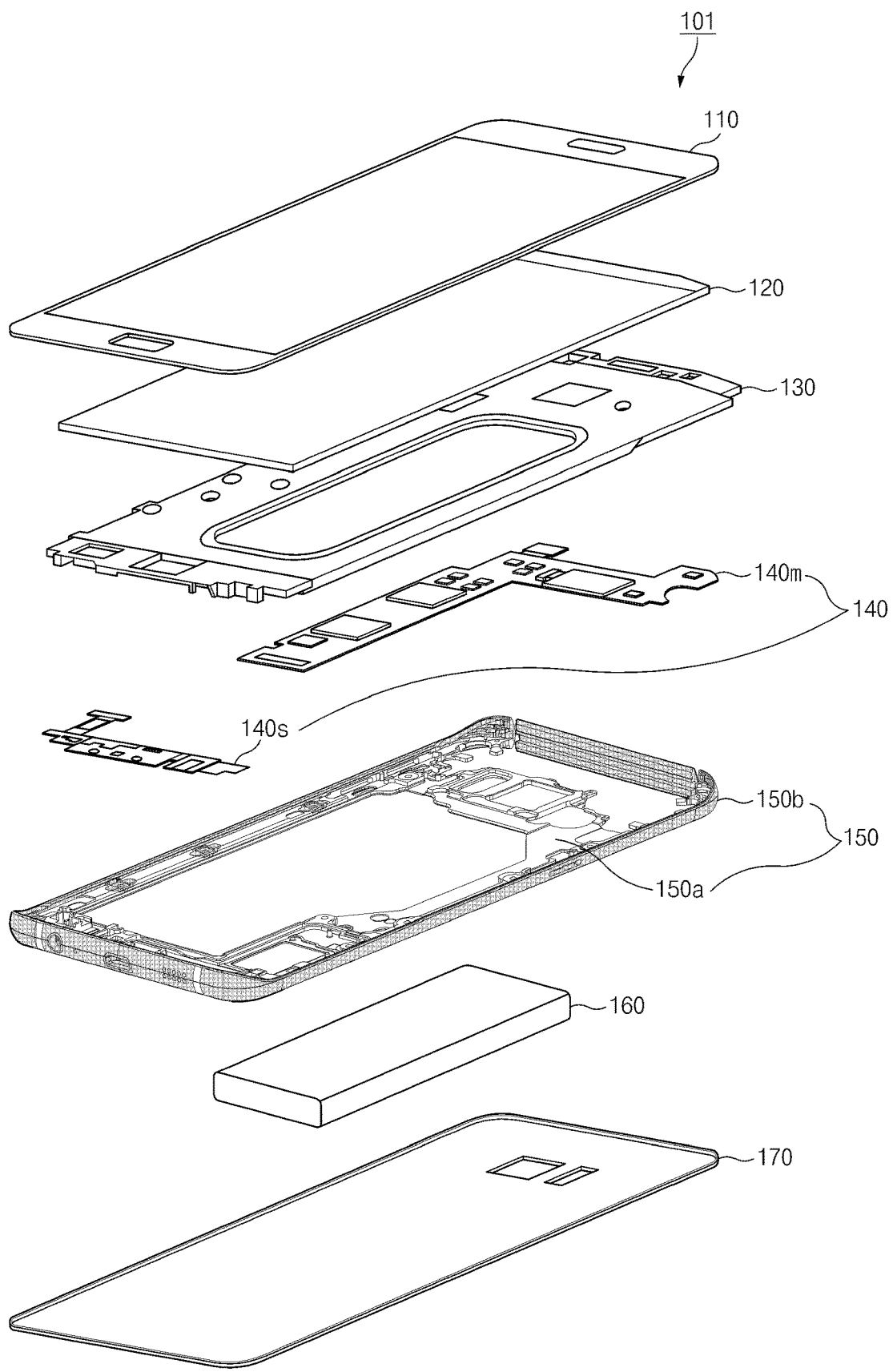
FIG. 1A illustrates an exploded perspective view of an electronic device, according to an embodiment of the present disclosure.

DETAILED DESCRIPTION OF EMBODIMENTS
OF THE PRESENT DISCLOSURE

Various embodiments of the present disclosure will be described with reference to the accompanying drawings, in which similar components may be marked by similar reference numerals. However, the present disclosure is not intended to be limited by the embodiments described herein. Accordingly, those of ordinary skill in the art will recognize that modifications, equivalents, and/or alternatives of the various embodiments described herein can be made without departing from the spirit and the scope of the present disclosure. The expressions "have", "include" and "comprise", used herein, refer to the existence of corresponding features (e.g., numeric values, functions, operations, or components) but do not exclude the presence of additional features.

The expressions "A or B", "at least one of A or/and B", or "one or more of A or/and B", used herein, may include any and all combinations of one or more of the associated listed items. For example, the expressions "A or B", "at least one of A and B", or "at least one of A or B" may refer to all of (1) A (2) B or (3) A and B.

The terms "first", "second", and the like, used herein, may refer to various elements regardless of the order or the importance, but do not limit the elements. For example, such terms are used only to distinguish an element from another element and do not limit the order and/or priority of the elements. For example, "a first user device" and "a second user device" may represent different user devices irrespective of sequence or importance. For example, without departing from the scope of the present disclosure, a first element may be referred to as a second element, and similarly, a second element may be referred to as a first element.

It should be understood that when an element (e.g., a first element) is referred to as being "(operatively or communicatively) coupled with/to" or "connected to" another element (e.g., a second element), the element can be directly coupled with/to or connected with/to the other element or an intervening element (e.g., a third element) may be present. In contrast, when an element (e.g., a first element) is referred to as being "directly coupled with/to" or "directly connected to" another element (e.g., a second element), it should be understood that there are no intervening element (e.g., a third element).

The expression "configured to", used herein, may be used interchangeably with, for example, the expressions "suitable for", "having the capacity to", "designed to", "adapted to", "made to", or "capable of". The expression "configured to" does not mean only "specifically designed to" in hardware. Instead, for example, the expression "a device configured to" may mean that the device is "capable of" operating together with another device or other components. For example, a "processor configured to perform A, B, and C" may mean a dedicated processor (e.g., an embedded processor) for performing a corresponding operation or a generic-purpose processor (e.g., a central processing unit (CPU) or an application processor (AP)) which may perform corresponding operations by executing one or more software programs which are stored in a memory device.

Terms used in this specification are used to describe specified embodiments of the present disclosure and are not intended to limit the scope of the present disclosure. The terms of a singular form may include plural forms as well, unless otherwise specified. Unless otherwise defined herein, all the terms used herein, including technical or scientific terms, may have the same meaning as those commonly understood by a person skilled in the art to which the present disclosure pertains. It will be further understood that terms, which are defined in a generally used dictionary, should be interpreted as is customary in the relevant related art and not in an idealized or overly formal manner unless expressly so defined herein. In some cases, even if terms are defined in the specification, they should not be interpreted to exclude embodiments of the present disclosure.

An electronic device according to an embodiment of the present disclosure may include at least one of a smartphone, a tablet PC, a mobile phone, a video telephone, an electronic book reader, a desktop PC, laptop PC, a netbook computer, a workstation, a server, a personal digital assistant (PDA), a portable multimedia player (PMP), an MP3 player, a mobile medical device, a camera, and a wearable device. The wearable device may include an accessory (e.g., a watch, rings, bracelets, ankle bracelets, glasses, contact lenses, or head-mounted devices (HMDs)), a cloth-integrated type (e.g., electronic clothes), a body-attached type (e.g., a skin pad or tattoo), or an implantable type (e.g., an implantable circuit).

In some embodiments of the present disclosure, the electronic device may be one of home appliances. The home appliance may include at least one of a digital versatile disk (DVD) player, an audio device, a refrigerator, an air conditioner, a cleaner, an oven, a microwave oven, a washing machine, an air cleaner, a set-top box, a home automation control panel, a security control panel, a TV box (e.g., Samsung HomeSync™, Apple TV™, or Google TV™), a game console (e.g., Xbox™ or PlayStation™), an electronic dictionary, an electronic key, a camcorder, or an electronic panel.

In another embodiment of the present disclosure, the electronic device may include at least one of various medical devices (e.g., portable medical measurement devices (e.g., a blood glucose meter, a heart rate measuring device, a blood pressure measuring device, and a body temperature measuring device), a magnetic resonance angiography (MRA) device, a magnetic resonance imaging (MRI) device, a computed tomography (CT) device, a photographing device, and an ultrasonic device), a navigation system, a global navigation satellite system (GNSS), an event data recorder (EDR), a flight data recorder (FDR), a vehicular infotainment device, electronic devices for vessels (e.g., a navigation device for vessels and a gyro compass), an avionics device, a security device, a vehicular head unit, an industrial or home robot, an automatic teller machine (ATM), a point of sales (POS) device, or an Internet of things (IoT) device (e.g., a light bulb, a sensor, an electricity or gas meter, a spring cooler device, a fire alarm device, a thermostat, an electric pole, a toaster, a sporting apparatus, a hot water tank, a heater, and a boiler).

According to some embodiments of the present disclosure, the electronic device may include at least one of furniture or a part of a building/structure, an electronic board, an electronic signature receiving device, a projector, or various measurement devices (e.g., a water, electricity, gas, or electric wave measuring devices).

The electronic device may be a flexible electronic device.

The electronic device may be one or a combination of the aforementioned devices. Further, the electronic device is not limited to the aforementioned devices, but may include new electronic devices produced due to the development of technologies.

Hereinafter, electronic devices according to an embodiment of the present disclosure will be described with reference to the accompanying drawings. The term "user" used herein may refer to a person who uses an electronic device or may refer to a device (e.g., an artificial intelligence electronic device) that uses an electronic device.

FIG. 1A illustrates an exploded perspective view of an electronic device, according to an embodiment of the present disclosure.

Referring to FIG. 1A, an exploded perspective view of an electronic device 101 is provided. The electronic device 101 includes a front glass cover 110, a display 120, a bracket 130, a circuit board 140, a housing 150, a battery 160, and a rear cover 170. The electronic device 101 may not include some elements illustrated in FIG. 1A, or may further include elements that are not illustrated in FIG. 1A.

The front glass cover 110 may transmit light generated by the display 120. Further, a user may perform a touch (including a contact using an electronic pen) by bringing a part (e.g., a finger) of his or her body into contact with the front glass cover 110. The front glass cover 110 may be formed of tempered glass, reinforced plastic, or a flexible polymer to protect the display 120 and the electronic device 101, on which the display 120 is mounted, from an external impact. According to various embodiments, the front glass cover 110 also may be referred to also as a glass window.

The display 120 may output content (e.g., a text, an image, a video, an icon, a widget, or a symbol) or may receive a touch input (a touch, a gesture, hovering, or a force touch) from the user. To achieve this, the display 120 may include a display panel, a touch panel, and/or a pressure sensor. At least one of the display panel, the touch panel, and/or the pressure sensor may be bonded to another configuration by using an optical clean adhesive (OCA).

The display panel of the display 120 may include a liquid crystal display (LCD) panel, a light emitting diode (LED) display panel, an organic light emitting diode (OLED) display panel, a micro electromechanical system (MEMS) display panel, or an electronic paper display panel. Further the touch panel of the display 120 may include a capacitive touch panel, a pressure-sensitive touch panel, a resistive touch panel, an infrared ray touch panel, or an ultrasonic touch panel.

The bracket 130 may be disposed under the display 120 and on the circuit board 140. The bracket 130 may be coupled to the display 120 and the circuit board 140 to physically support the display 120 and the circuit board 140.

A whole part or a portion of the bracket 130 may be formed of a conductive member, or may include a separate conductive member. The conductive member implemented in the bracket 130 may be referred to also as a first conductive member. That is, the first conductive member may be included as at least a portion of the bracket 130.

The circuit board 140 may include a main circuit board 140m and a sub-circuit board 140s. The main circuit board 140m and the sub-circuit board 140s may be electrically connected to each other through a flexible printed circuit board (FPCB). The circuit board 140 may be implemented by a printed circuit board (PCB) or a FPCB. The various electronic components, elements, printed circuits of the electronic device 101 may be mounted on the circuit board 140. According to various embodiments, the circuit board 140 may be referred to also as a main board.

The housing 150 may define an internal appearance and/or an external appearance of the electronic device 101. The housing 150 may be referred to also as a rear case, a rear housing, or a rear plate. The housing 150 may include a first area 150a that is not exposed to the outside of the electronic device 101, and a second area 150b that is exposed to an outer side surface of the electronic device 101. For example, the first area 150a may be a plastic injection-molded member such that the circuit board 140 is not exposed through the first area 150a. Further, for example, the second area 150b may correspond to a side housing of the electronic device 101, such as the bezel, formed of metal.

A whole part or a portion of the housing 150 (e.g., the second area 150b) may be formed of a conductive member, or may include a separate conductive member. The conductive member implemented in the housing 150 may be referred to as a second conductive member. That is, the second conductive member may be included as at least a portion of the housing 150. For example, the second conductive member may be included as at least a portion of the second area 150b of the housing 150.

At least a portion of the second area 150b of the housing 150 implemented by a conductive member may be utilized as an antenna radiator for transmitting and receiving a signal of a specific frequency. Accordingly, the second conductive member may constitute at least a portion of the antenna radiator.

The battery 160 may convert chemical energy into electrical energy and vice versa. The battery 160 may supply the electrical energy to the display 120 and various components mounted on the circuit board 140. Further, the battery 160 may store the energy. The circuit board 140 may include a power management module for managing charging/discharging of the battery 160.

The rear cover 170 may be coupled to a rear surface (a surface that is opposite to the surface on which the display 120 is disposed) of the housing 150. The rear cover 170 may be formed of tempered glass, an injection-molded plastic material, and/or a metal material. The rear cover 170 may be integrally formed with the housing 150 or may be detachably mounted on the housing 150 by the user.

Figure 1B:
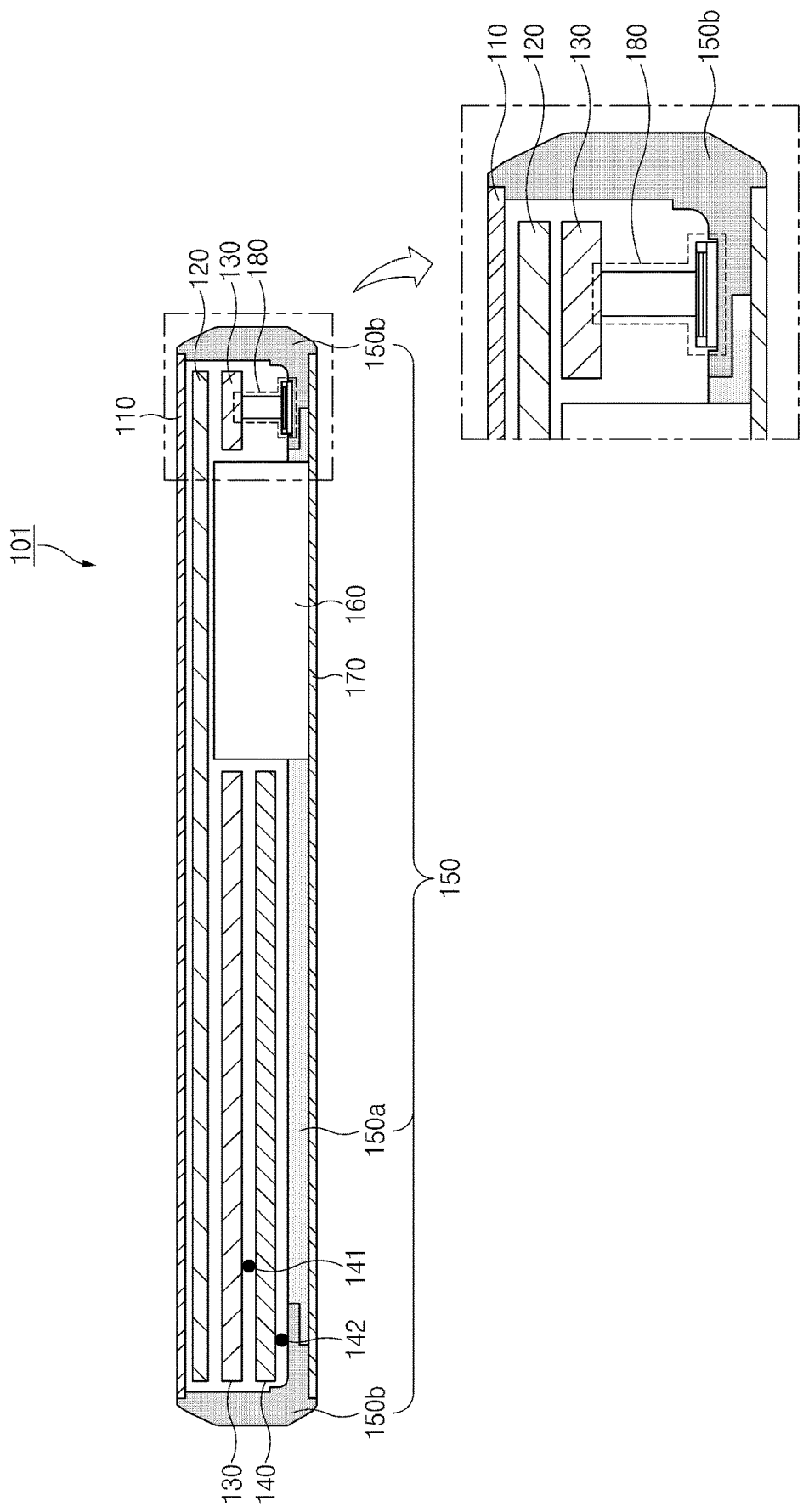
FIG. 1B illustrates a cross-sectional view of an electronic device, according to an embodiment of the present disclosure.

FIG. 1B illustrates a cross-sectional view of an electronic device, according to an embodiment of the present disclosure.

Referring to FIG. 1B, a cross-sectional view of the electronic device 101 is provided showing the front glass cover 110, the display 120, the bracket 130, the circuit board 140, the housing 150, the battery 160, and the rear cover 170 sequentially disposed. The first conductive member implemented in the bracket 130 may be electrically connected to the circuit board 140 at a first point 141. The first point 141 may correspond to any one point on a circuit printed on the circuit board 140. For example, the first point 141 may be electrically connected to a ground area of the circuit board 140. Accordingly, the first conductive member of the bracket 130 may be used as a ground.

The second conductive member (e.g., the second area 150b) included in the housing 150 may be electrically connected to the circuit board 140 at a second point 142, and may be exposed to the outside of the electronic device 101. At least a portion of the second conductive member may be utilized as a part of an antenna radiator for transmitting and receiving a signal of a specific frequency. In this case, the wireless communication circuit disposed in the circuit board 140 may feed electric power to the second conductive member through the second point 142.

The electronic device 101 may further include in the housing 150, a connection member 180 connecting the first conductive member implemented in the bracket 130 and the second conductive member (e.g., the second area 150*b*). The first conductive member and the second conductive member may contact each other through the connection member 180. The configuration of the connection member 180 will be described in more detail with reference to FIG. 2.

Figure 2:
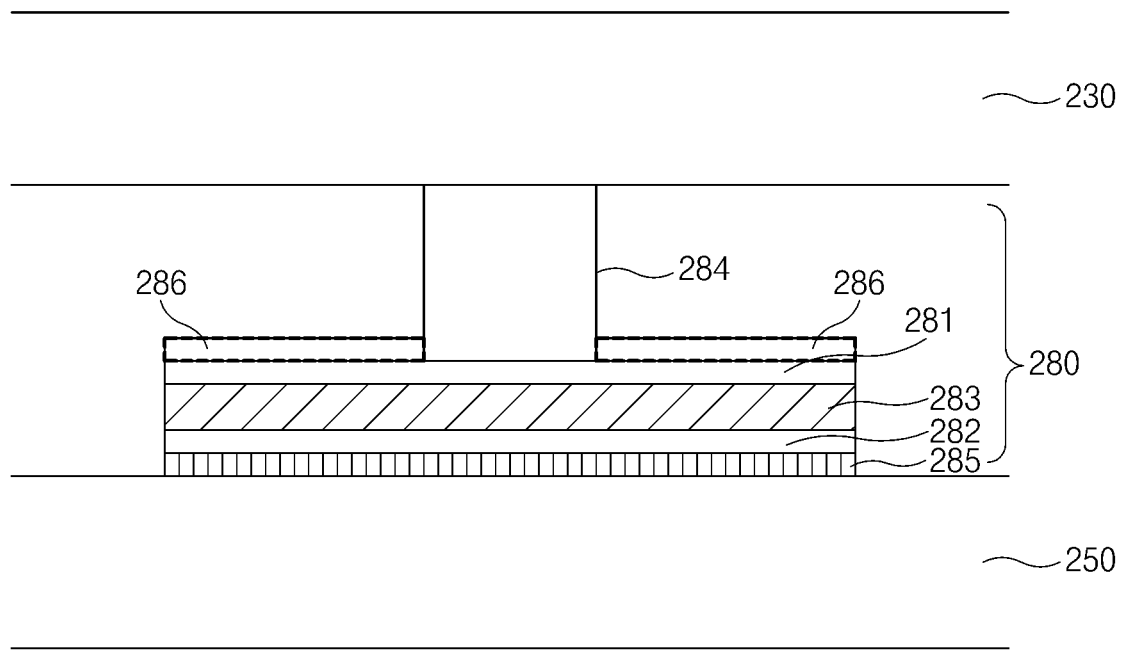
FIG. 2 illustrates a cross-sectional view of a connection member of an electronic device, according to an embodiment of the present disclosure.

FIG. 2 illustrates a cross-sectional view of a connection member of an electronic device, according to an embodiment of the present disclosure.

Referring to FIG. 2, a connection member 280 interposed between a first conductive member 230 and a second conductive member 250 is illustrated. The first conductive member 230 may constitute at least a portion of the bracket 130, or may be separately manufactured to be included in the bracket 130. The second conductive member 250 may correspond to at least a portion of the second area 150*b* of the housing 150.

The connection member 280 includes a first conductive layer 281, a second conductive layer 282, a dielectric layer 283, a first conductive part 284, a second conductive part 285, and an insulation layer 286. The connection member 280 may not include some elements illustrated in FIG. 2, or may further include elements that are not illustrated in FIG. 2.

The first conductive layer 281 may be electrically connected to the first conductive member 230. For example, the first conductive layer 281 may be electrically connected to the first conductive member 230 through the first conductive part 284.

The second conductive layer 282 may be electrically connected to the second conductive member 250. For example, the first conductive layer 282 may be electrically connected to the second conductive member 250 through the first conductive part 285.

The dielectric layer 283 may be located between the first conductive layer 281 and the second conductive layer 282. For example, the dielectric layer 283 may have a permittivity (ε) of a specific value (e.g., a dielectric constant (εr) of 30) or more.

The first conductive layer 281, the second conductive layer 282, and the dielectric layer 283 may constitute a capacitor. The capacitance component formed by the first conductive layer 281, the second conductive layer 282, and the dielectric layer 283 may be set to cut off a signal of a specific frequency or less. To achieve this, the value of the capacitance component may be set to be larger than a specific value (e.g., 33 pF).

The first conductive part 284 and the second conductive part 285 may include solder or a conductive tape for a C-lip, a conductive elastomer, a conductive gasket, conductive silicon, or a surface-mounted device (SMD).

For example, one side of the first conductive part 284 may be coupled to, in contact with, or attached to at least a portion of a surface of the first conductive layer 281, and another side of the first conductive part 284 may be coupled to, in contact with, or attached to at least a portion of a surface of the first conductive member 230. That is, the first conductive layer 281 may be electrically connected to the first conductive member 230 through the first conductive part 284.

Similarly one side of the second conductive part 285 may be coupled to, in contact with, or attached to at least a portion of a surface of the second conductive layer 282, and another side of the second conductive part 285 may be coupled to, in contact with, or attached to at least a portion of a surface of the second conductive member 250. That is, the second conductive layer 282 may be electrically connected to the second conductive member 250 through the second conductive part 285.

The insulation layer 286 may be disposed on a surface of the first conductive layer 281, which does not contact the first conductive part 284. The insulation layer 286 is adapted to prevent a short circuit between the first conductive member 230 and the second conductive member 250, and may function as a guide for seating the first conductive part 284 on the first conductive layer 281. The insulation layer 286 may be omitted.

Although FIG. 2 illustrates that the first conductive layer 281 is connected to the first conductive member 230, the first conductive layer 281 may be connected to the second conductive member 250. Similarly, the second conductive layer 282 may be connected to the first conductive member 230.

Figure 3A:
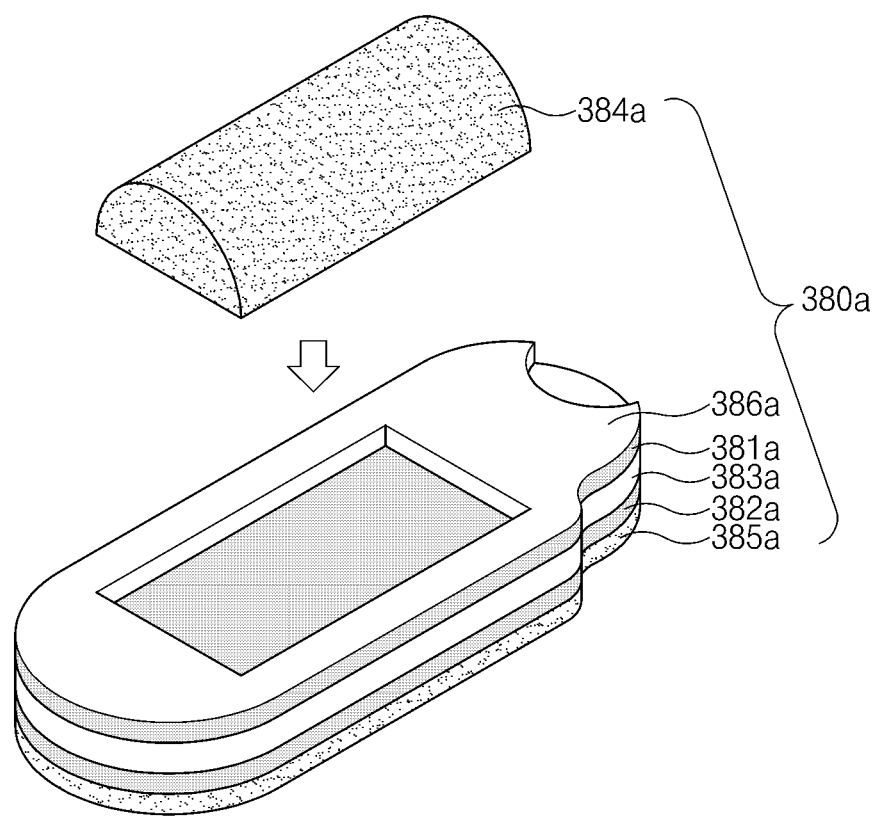
FIGS. 3A to 3D illustrate a connection member of an electronic device, according to an embodiment of the present disclosure.

FIGS. 3A to 3D illustrate a connection member of an electronic device, according to an embodiment of the present disclosure Referring to FIG. 3A, a connection member 380*a* is provided. The connection member 380*a* includes a first conductive layer 381*a*, a second conductive layer 382*a*, a dielectric layer 383*a*, a first conductive part 384*a*, a second conductive part 385*a*, and an insulation layer 386*a*.

The first conductive part 384*a* may be formed of conductive silicon (e.g., Poron™) The first conductive part 384*a* may be seated in a through-hole formed in the insulation layer 386*a*, and may electrically contact the first conductive layer 381*a* through the through-hole. The first conductive part 384*a* may electrically contact a first conductive member on a side that is opposite to the first conductive part 384*a*. Accordingly, the first conductive layer 381*a* may be electrically connected to the first conductive member through the first conductive part 384*a*.

The second conductive part 385*a* may be formed of a conductive tape. One surface of the second conductive part 385*a* may be attached to the second conductive layer 382*a*, and another surface of the second conductive part 385*a* may be attached to the second conductive member. Accordingly, the second conductive layer 382*a* may be electrically connected to the second conductive member through the second conductive part 385*a*.

Figure 3B:
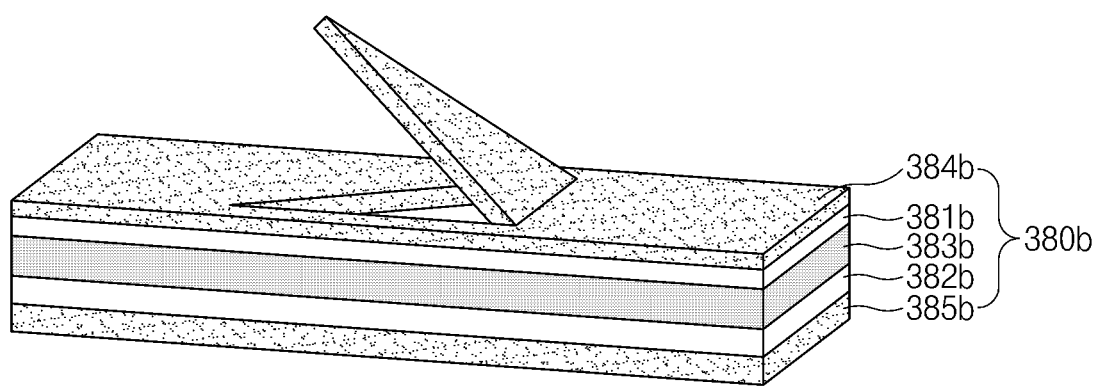

Referring to FIG. 3B, a connection member 380*b* is provided. The connection member 380*b* includes a first conductive layer 381*b*, a second conductive layer 382*b*, a dielectric layer 383*b*, a first conductive part 384*b*, and a second conductive part 385*a*.

The first conductive part 384*b* may be formed of a metal member having a finger structure. The upwardly protruding finger structure of the first conductive part 384*b* may electrically contact a first conductive member. Further, the bottom surface of the first conductive part 384*b* may be electrically attached to the first conductive layer 381*b*. Accordingly, the first conductive layer 381*b* may be electrically connected to the first conductive member through the first conductive part 384*b*.

The second conductive part 385*b* may be formed of a conductive tape. One surface of the second conductive part 385*b* may be attached to the second conductive layer 382*b*, and another surface of the second conductive part 385*b* may be attached to the second conductive member. Accordingly, the second conductive layer 382b may be electrically connected to the second conductive member through the second conductive part 385b.

Figure 3C:
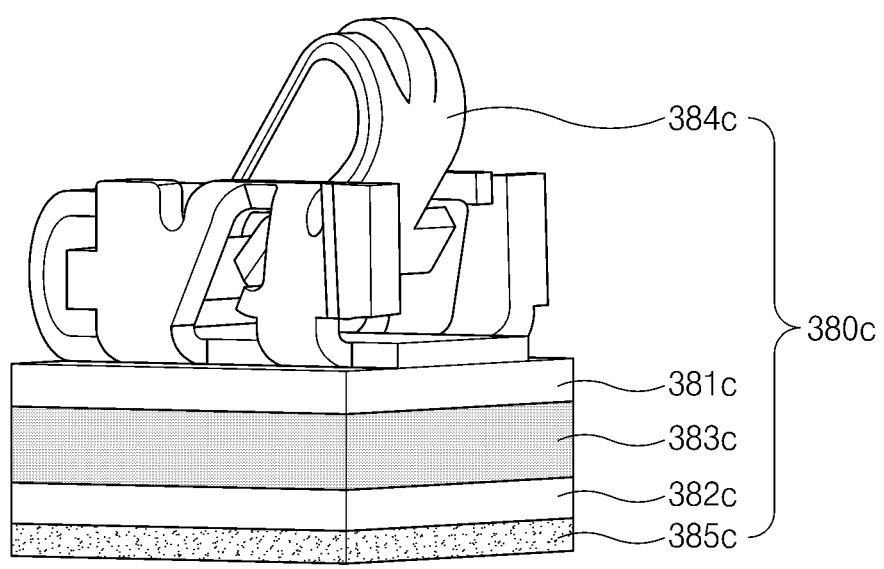

Referring to FIG. 3C, a connection member 380c is provided. The connection member 380c includes a first conductive layer 381c, a second conductive layer 382c, a dielectric layer 383c, a first conductive part 384c, and a second conductive part 385c.

The first conductive part 384c may be formed of a C-clip of a metal. The upwardly protruding portion of the first conductive part 384c may electrically contact a first conductive member. Further, the bottom surface of the first conductive part 384c may be electrically attached to the first conductive layer 381c. Accordingly, the first conductive layer 381c may be electrically connected to the first conductive member through the first conductive part 384c.

The second conductive part 385c may be formed of a conductive tape. One surface of the second conductive part 385c may be attached to the second conductive layer 382c, and another surface of the second conductive part 385c may be attached to the second conductive member. Accordingly, the second conductive layer 382c may be electrically connected to the second conductive member through the second conductive part 385c.

Figure 3D:
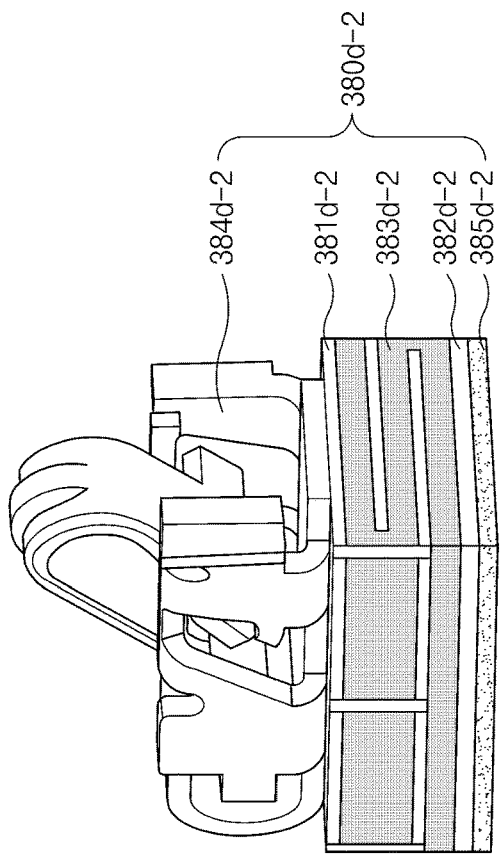
Figure 3D:
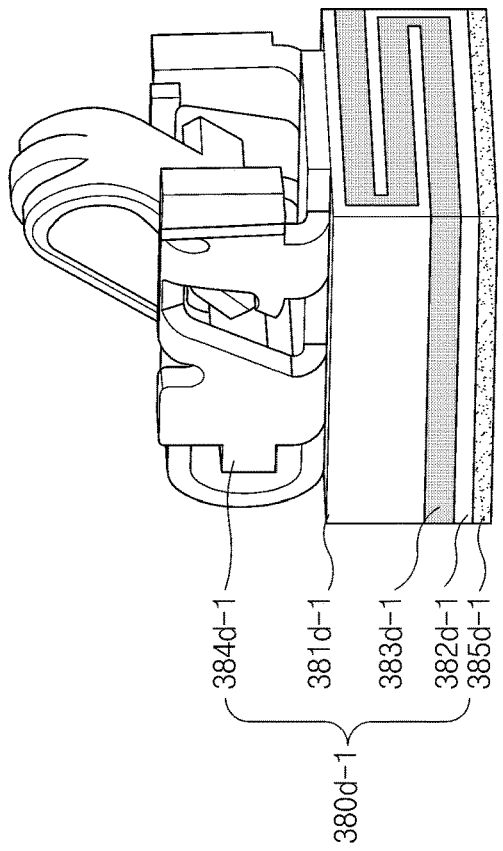

Referring to FIG. 3D, a connection member 380d-1 and a connection member 380d-2 are provided. Each of the connection members 380d-1 and 380d-2 include a first conductive layer 381d-1 and 381d-2, a second conductive layer 382d-1 and 382d-2, a dielectric layer 383d-1 and 383d-2, a first conductive part 384d-1 and 384d-2, and a second conductive part 385d-1 and 385d-2.

The first conductive parts 384d-1 and 384d-2 may be formed of a C-clip of a metal, and the second conducive parts 385d-1 and 385d-2 may be formed of a conductive tape.

The first conductive layers 381d-1 and 381d-2 and the second conductive layers 382d-1 and 382d-2 may have at least one bending portion. Then, the dielectric layers 383d-1 and 383d-2 may be divided into a plurality of layers by the at least one bending portion.

Although FIGS. 3A to 3D illustrate that the first conductive layer is connected to the first conductive member, the first conductive layer may be connected to the second conductive member. Similarly, the second conductive layer may be connected to the first conductive member.

Figure 4:
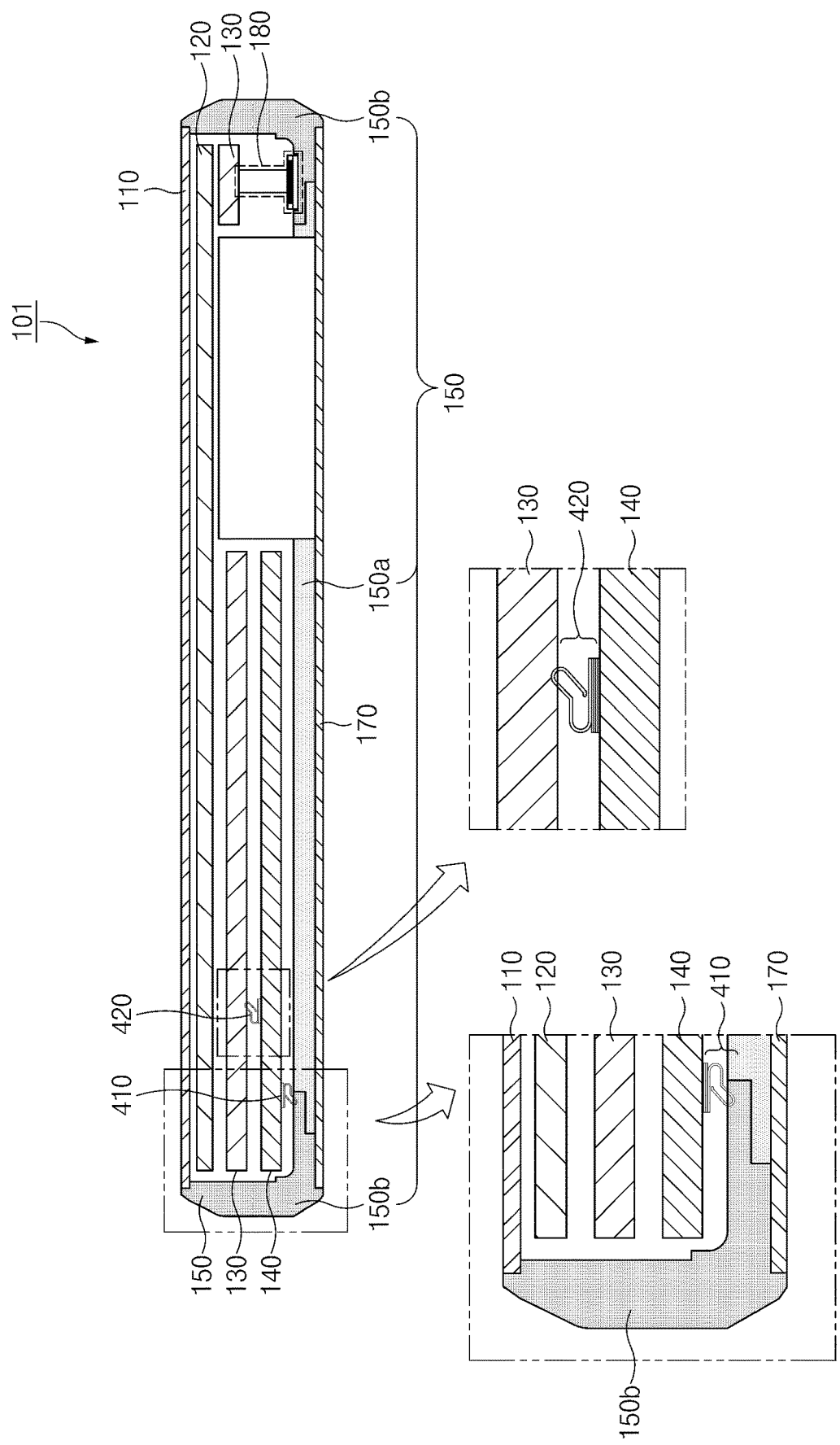
FIG. 4 illustrates a cross-sectional view of an electronic device, according to an embodiment of the present disclosure.

FIG. 4 illustrates a cross-sectional view of an electronic device, according to an embodiment of the present disclosure.

Referring to FIG. 4, the electronic device 101 is provided showing the front glass cover 110, the display 120, the bracket 130 including a first conductive member, the circuit board 140, the housing 150 including a second conductive member, the battery 160, and the rear cover 170 sequentially disposed.

Connection members 410 and 420 may connect the circuit board 140 and the conducive members. Each of the connection members 410 and 420 may include a first conductive layer electrically connected to the circuit board, a second conductive layer electrically connected to the conductive member, and a dielectric layer located between the first conductive layer and the second conductive layer.

The first conductive layer of the connection member 410 may be attached to the circuit board 140 while a first conductive part (e.g., a conductive tape) coupled to at least a portion of a surface of the first conductive layer is interposed therebetween. Accordingly, the connection member 410 may be electrically connected to the circuit board 140. For example, the first conductive layer of the connection member 410 may be electrically connected to a ground area of the circuit board 140. Further the second conductive layer of the connection member 410 may be connected to the second conductive member included in the housing 150 while the second conductive part (e.g., a C-clip) is interposed therebetween. Accordingly, the connection member 410 may be connected to the second conductive member included in the housing 150.

The first conductive layer of the connection member 420 may be attached to the circuit board 140 while a first conductive part (e.g., a conductive tape) is interposed therebetween. Accordingly, the connection member 410 may be electrically connected to the circuit board 140. For example, the first conductive layer of the connection member 410 may be electrically connected to a ground area of the circuit board 140. Further the second conductive layer of the connection member 410 may be connected to the first conductive member included in the bracket 130 while the second conductive part (e.g., a C-clip) is interposed therebetween. Accordingly, the connection member 410 may be connected to the second conductive member included in the bracket 130.

Figure 5:
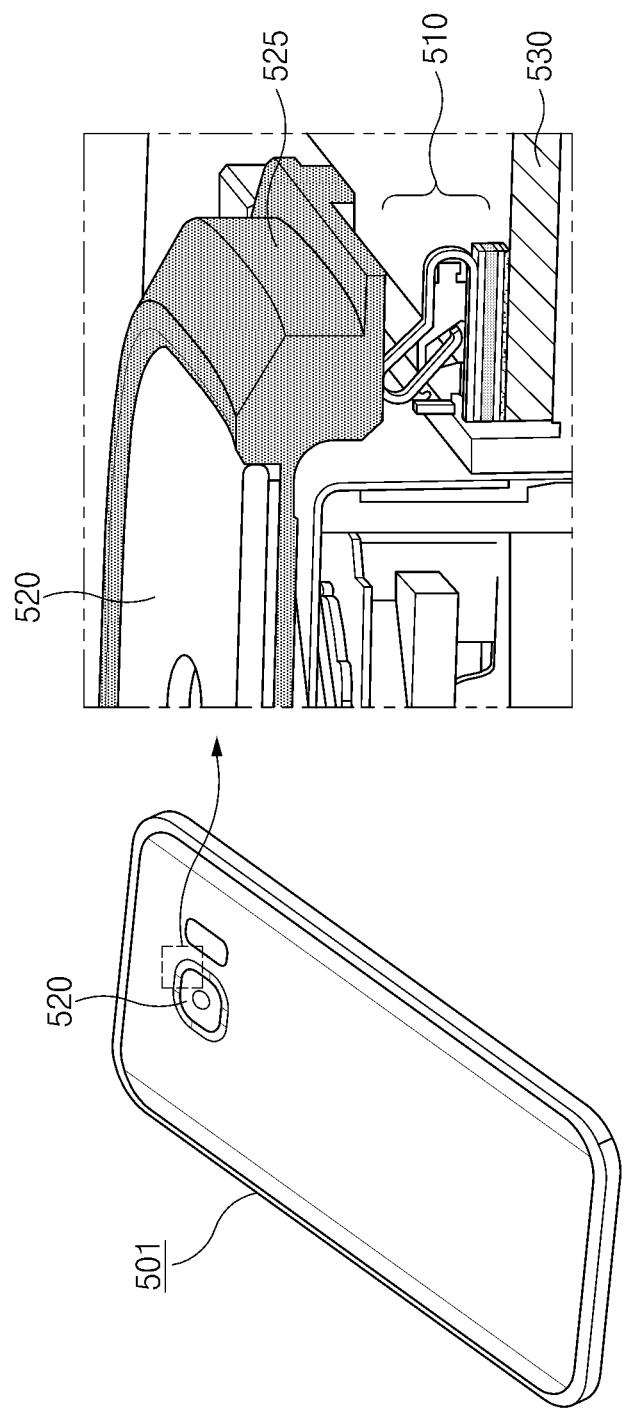
FIG. 5 illustrates a mounting structure of a connection member of an electronic device, according to an embodiment of the present disclosure.

FIG. 5 illustrates a mounting structure of a connection member of an electronic device, according to an embodiment of the present disclosure.

Referring to FIG. 5, an electronic device 501, on which a connection member 510 is mounted, is provided. A rear surface of the electronic device 501 may include a camera 520 and a metal edge 525 (i.e., a conductive member) surrounding the camera 520.

The connection member 510 may include a first conductive layer electrically connected to a circuit board 530, a second conductive layer electrically connected to the conductive member, and a dielectric layer located between the first conductive layer and the second conductive layer. The first conductive layer of the connection member 510 may be attached to the circuit board 530 while a first conductive part (e.g., a conductive tape) is interposed therebetween. Accordingly, the connection member 510 may be electrically connected to the circuit board 530. For example, the first conductive layer of the connection member 510 may be electrically connected to a ground area of the circuit board 530. Further the second conductive layer of the connection member 510 may be connected to the metal edge 525 surrounding the camera 520 while the second conductive part (e.g., a C-clip) is interposed therebetween. Accordingly, the connection member 410 may be connected to the metal edge 525.

Figure 6:
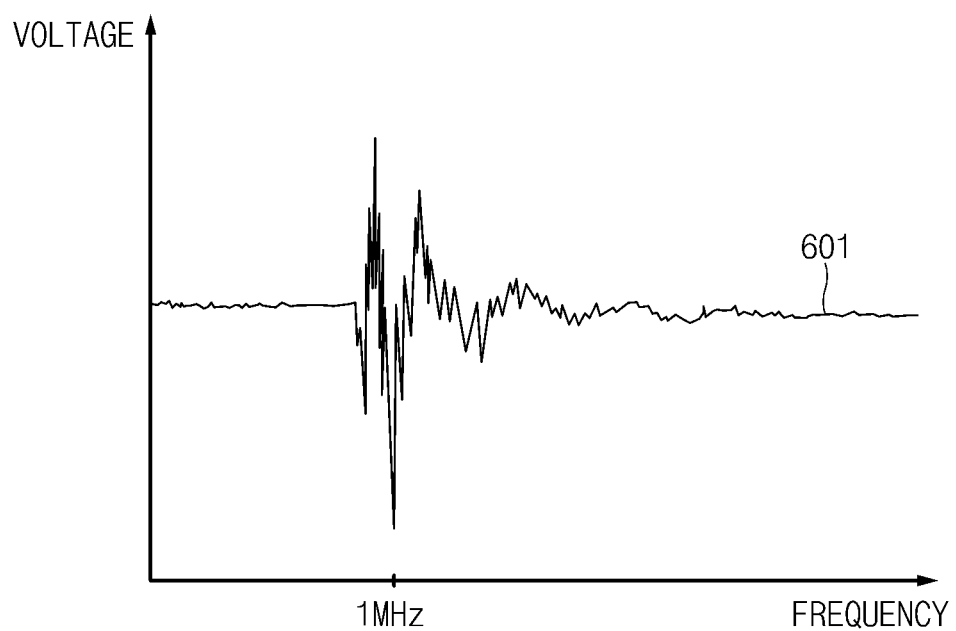
FIG. 6 is a graph depicting frequency characteristics of electrostatic discharges (ESDs), according to an embodiment of the present disclosure.

FIG. 6 is a graph depicting frequency characteristics of electrostatic discharges (ESDs), according to an embodiment of the present disclosure.

Referring to FIG. 6, a graph 601 depicting frequency characteristics of voltages of electrostatic discharges is provided. As shown in graph 601, the electrical energy of the electrostatic discharges is mainly concentrated around 1 MHz. The electrostatic discharges may have a maximum voltage of 10 kV around 1 MHz. When the electrostatic discharges are introduced into the electronic device 101, the life spans of the circuit elements may be shortened, or the circuit elements may be degraded or damaged. Further, when the electrostatic discharges are introduced into a human body, an electric shock may be caused.

Figure 7:
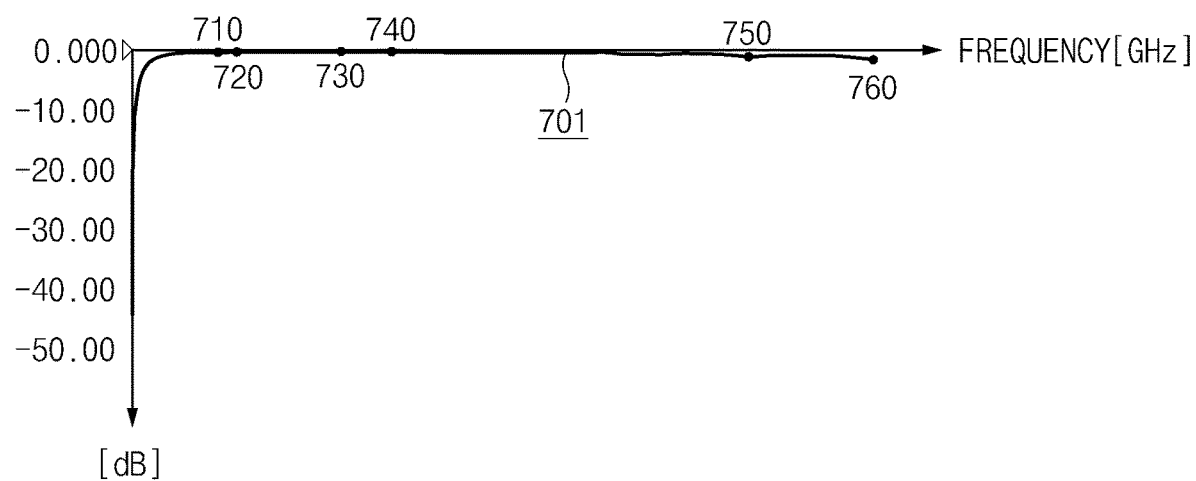
FIG. 7 is a graph depicting frequency characteristics of a connection member of an electronic device, according to an embodiment of the present disclosure.

FIG. 7 is a graph depicting frequency characteristics of a connection member of an electronic device, according to an embodiment of the present disclosure.

Referring to FIG. 7, a graph 701 depicting frequency characteristics (i.e., transmission coefficient (S21)) of the connection member is provided. As described above, the connection member may have a specific capacitance component. The capacitance component may cut off a signal of a specific frequency or less. That is, the connection member may function as a high pass filter (HPF) as illustrated in graph 701. To achieve this, the capacitance component may be set to be larger than a specific value (e.g., 33 pF).

According to graph 701, the transmission coefficient (S21) at 700 MHz is −0.3005 dB (point 710), the transmission coefficient (S21) at 850 MHz is −0.2730 dB (point 720), the transmission coefficient (S21) at 1.7 GHz is −0.2228 dB (point 730), the transmission coefficient (S21) at 2.1 GHz is −0.2395 dB (point 740), and the transmission coefficient (S21) at 6.0 GHz is −1.4951 dB (point 760).

Accordingly, a signal of a network, such as a cellular network, a Wi-Fi network, or a Bluetooth network, which uses a frequency of not less than 700 MHz may pass the connection member substantially without loss. Accordingly when the conductive member is used as a portion of an antenna radiator, the connection member may have an effect of being substantially short-circuited. Meanwhile, as illustrated in FIG. 6, the electrostatic discharges, of which energy is mostly distributed at a frequency of about 1 MHz, or leakage DC currents of the electronic device 101 may be interrupted by the connection member.

FIG. 8 is a table of rates of change in capacitance due to ESDs of connection members, according to an embodiment of the present disclosure.

Referring to FIG. 8, a table of rates of change in capacitance due to ESDs of ten (10) connection members mounted in each of the electronic devices is provided. Before electrostatic discharges were applied, the capacitances of the ten (10) connection members were 46 pF to 47 pF.

Thereafter, electrostatic discharges of 10 kV were applied to the electronic devices 100 times, respectively. When the electrostatic discharges were applied 100 times, the capacitances of the connection members were hardly changed or were reduced by about 2.2%. That is, the connection members were not damaged but the properties thereof were maintained.

Figure 9:
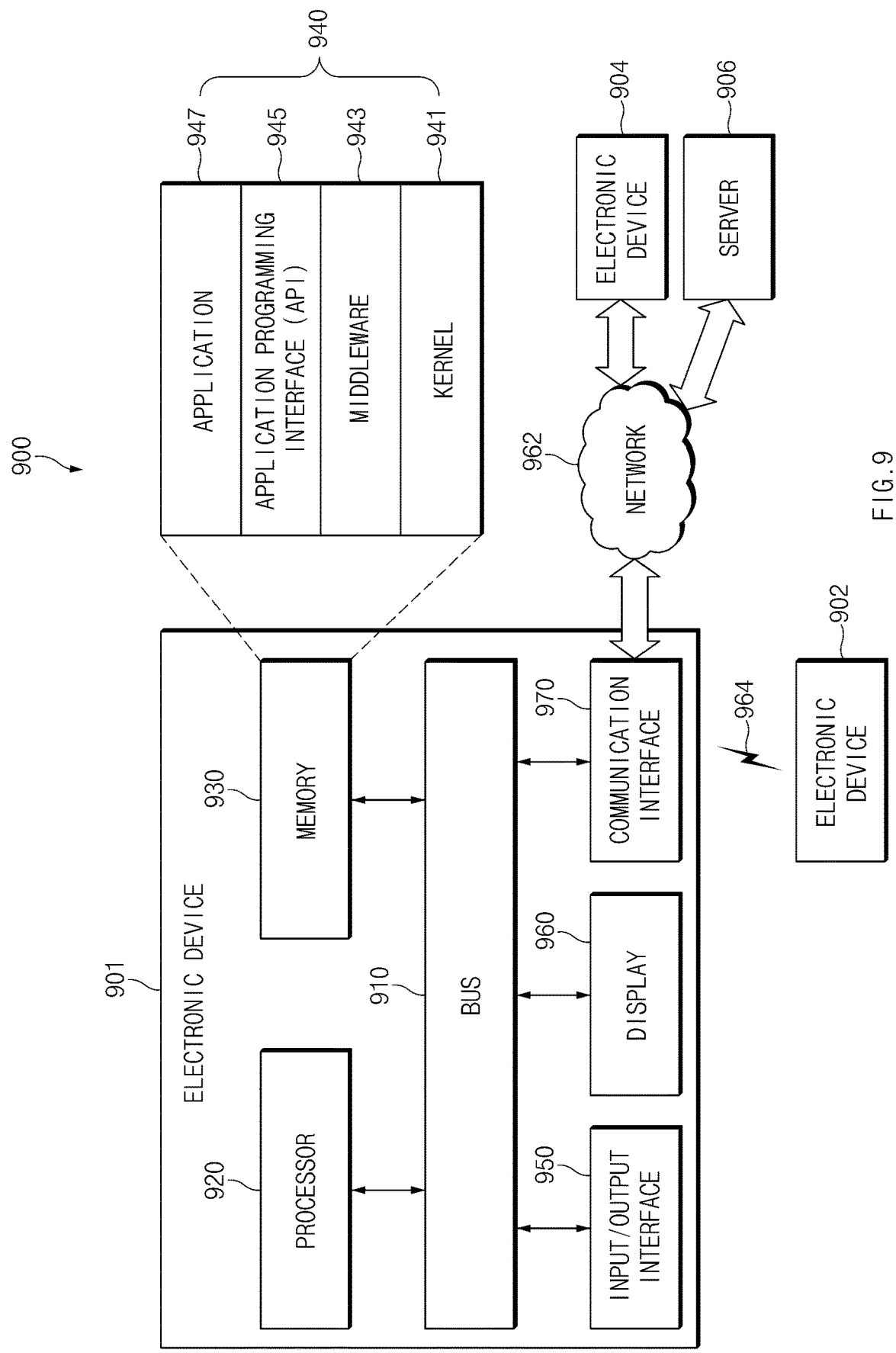
FIG. 9 is a block diagram of an electronic device in a network environment, according to an embodiment of the present disclosure.

FIG. 9 is a block diagram of an electronic device in a network environment, according to an embodiment of the present disclosure.

Referring to FIG. 9, an electronic device 901 in an electronic device 200 is provided. The electronic device 901 includes a bus 910, a processor 920, a memory 930, an input/output interface 950, a display 960, and a communication interface 970. The electronic device 901 may exclude at least one of the elements or may additionally include another element.

The bus 910 may include a circuit that connects the components 910 to 970 and transfers communications (e.g., control messages and/or data) between the components of the electronic device 901.

The processor 920 may include one or more of a CPU, an AP, or a communication processor (CP). The processor 920 may execute operations or data processing related to the control and/or communication of at least one other component of the electronic device 901.

The memory 930 may include volatile and/or nonvolatile memories. The memory 930 may store a command or data related to at least one other component of the electronic device 901. The memory 930 may store software and/or a program 940. The program 940 may include a kernel 941, middleware 943, an application programming interface (API) 945, and/or an application program (or applications) 947. At least some of the kernel 941, the middleware 943, or the API 945 may be referred to as an operating system (OS).

The kernel 941 may control or manage system resources (e.g., the bus 910, the processor 920, and the memory 930) that are used to execute operations or functions implemented in the other programs (e.g., the middleware 943, the API 945, or the applications 947). The kernel 941 may provide an interface through which the middleware 943, the API 945, or the applications 947 access individual components of the electronic device 901 to control or manage the system resources.

The middleware 943 may function as an intermediary that allows the API 945 or the applications 947 to communicate with the kernel 941 to exchange data.

The middleware 943 may process one or more work requests received from the applications 947, according to their priorities. For example, the middleware 943 may give a priority, by which a system resource (e.g., the bus 910, the processor 920, or the memory 930) of the electronic device 901 may be used, to at least one of the applications 947. For example, the middleware 943 may perform scheduling or load balancing for the one or more work requests by processing the one or more work requests according to the priority given to the at least one of the applications 947.

The API 945 is an interface used, by the applications 947, to control a function provided by the kernel 941 or the middleware 943, and may include at least one interface or function (e.g., an instruction) for file control, window control, image processing, and text control.

The input/output interface 950 may function as an interface that may transfer a command or data that is input from the user or another external device to another element of the electronic device 901. The input/output interface 950 may output a command or data received from another component of the electronic device 901 to the user or another external device.

The display 960 may include a LCD, a LED display, an OLED display, a MEMS display, or an electronic paper display. The display 960 may display various contents (e.g., a text, an image, a video, an icon, and a symbol). The display 960 may include a touch screen and receive a touch, a gesture, a proximity, or a hovering input using an electronic pen or the user's body.

The communication interface 970 may set a communication between the electronic device 901 and a first external electronic device 902, a second external electronic device 904, or a server 906. For example, the communication interface 970 may be connected to the first external electronic device 902 through short range communication 964 and may be connected to the second external electronic device 904 and the server 906 through a network 962 through a wireless communication or a wired communication to communicate with the external device.

The wireless communication is a cellular communication protocol, and may include cellular communication that uses at least one of long-term evolution (LTE), LTE-advanced (LTE-A), code division multiple access (CDMA), wideband CDMA (WCDMA), a universal mobile telecommunications system (UMTS), wireless broadband (WiBro), or a global system for mobile communications (GSM). The wireless communication may include the short-range communication 964. The short-range communication may include at least one of Wi-Fi, Bluetooth, Bluetooth low energy (BLE), Zigbee, near field communication, magnetic secure transmission (MST), radio frequency, a body airless network (BAN), or a GNSS.

An MST may generate a pulse according to a transmission of data by using an electromagnetic signal, and the pulse may generate a magnetic field signal. The electronic device 901 may transmit the magnetic field signal to a point of sales (POS) device, detect the magnetic field signal by using an MST reader, and restore the data by converting the detected magnetic signal into an electrical signal.

The GNSS may include at least one of a global positioning system (GPS), a global navigation satellite system (Glonass), a Beidou navigation satellite system (Beidou), or Galileo, the European global satellite-based navigation system, according to an in-use area or a bandwidth. Hereinafter, in the present disclosure, the term "GPS" may be interchangeably used with the term "GNSS".

The wired communication may include at least one of a universal serial bus (USB), a high definition multimedia interface (HDMI), recommended standard-232 (RS-232), and a plain old telephone service (POTS). The network 962 may include at least one of communication networks a computer network (e.g., a LAN or a WAN), the Internet, or a telephone network.

The first and second external electronic devices 902 and 904 may be the same or different type devices from the electronic device 901. The server 906 may include a group of one or more servers. All or some of the operations executed by the electronic device 901 may be executed by another or a plurality of electronic devices (e.g., the first and second external electronic devices 902 and 904 or the servers 906). When the electronic device 901 should execute some functions or services automatically or upon request, it may request at least some functions associated with the functions or services from another device (e.g. the first and second external electronic devices 901 and 904 or the server 906), in place of or in addition to directly executing the functions or services. The other electronic device (e.g., the external electronic device 902 or 904 or the server 906) may execute a requested function or an additional function, and may transfer the result to the electronic device 901. The electronic device 901 may process the received result directly or additionally, and may provide a requested function or service. To this end, cloud computing, distributed computing, or client-server computing technologies may be used.

Figure 10:
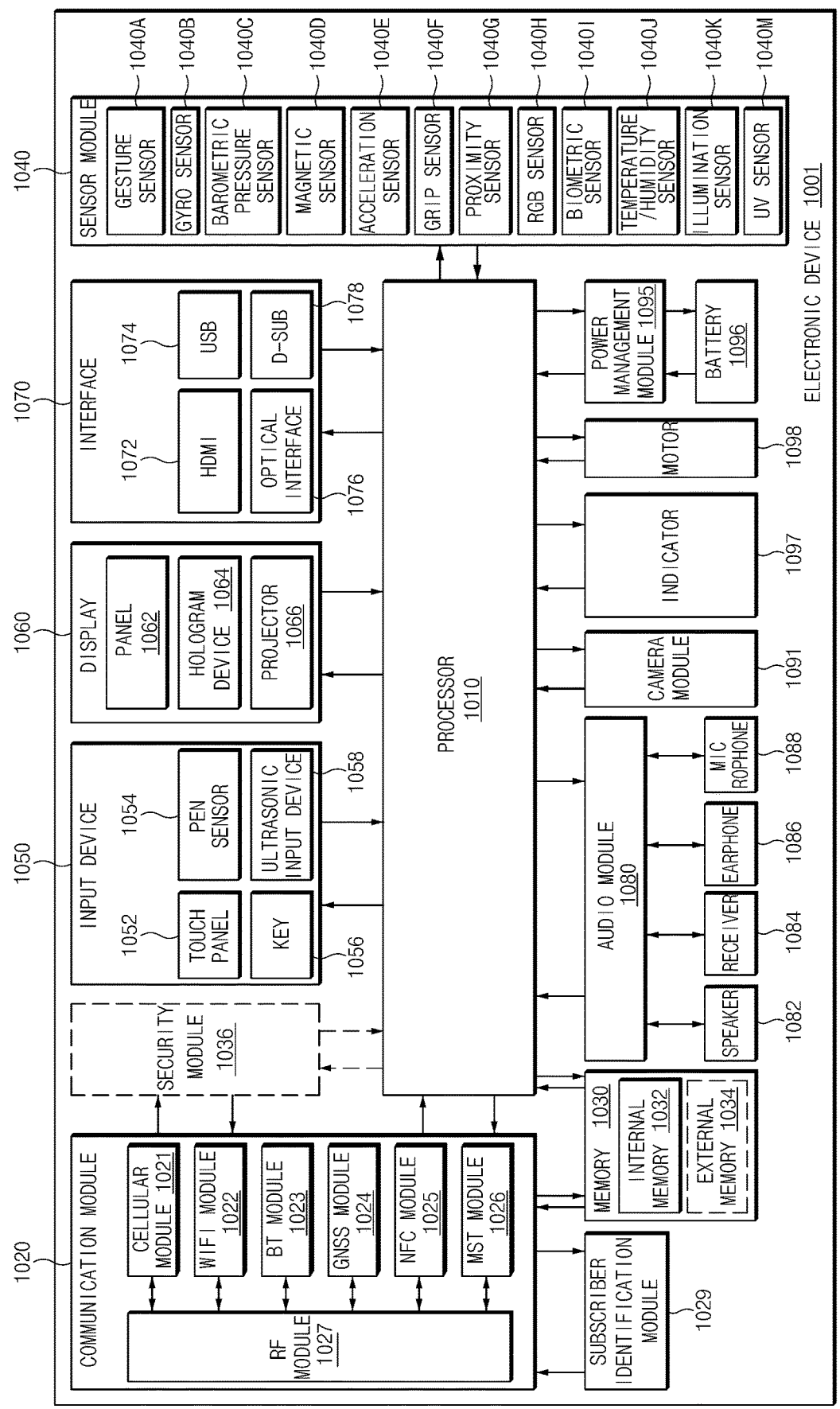
FIG. 10 is a block diagram of a configuration of an electronic device, according to an embodiment of the present disclosure.

FIG. 10 is a block diagram of a configuration of an electronic device, according to an embodiment of the present disclosure.

Referring to FIG. 10, an electronic device 1001 is provided. The electronic device 1001 includes a processor 1010, a communication module 1020, a subscriber identification module (SIM) 1029, a memory 1030, a security module 1036, a sensor module 1040, an input device 1050, a display 1060, an interface 1070, an audio module 1080, a camera module 1091, a power management module 1095, a battery 1096, an indicator 1097, or a motor 1098.

The processor 1010 may control a plurality of hardware or software components of the electronic device 1001 connected to the processor 1010 by driving an operating system or an application program and perform a variety of data processing and calculations. The processor 1010 may be implemented by a system on chip (SoC). The processor 1010 may further include a graphical processing unit (GPU) and/or an image signal processor (ISP). The processor 1010 may include at least some (e.g., a cellular module 1021) of the components of the electronic device 1001. The processor 1010 may load instructions or data, received from at least one other component (e.g., a non-volatile memory), in a volatile memory to process the loaded instructions or data, and may store various types of data in a non-volatile memory.

The communication module 1020 includes the cellular module 1021, a Wi-Fi module 1022, a Bluetooth module 1023, a GNSS module 1024 (e.g., a GPS module, a Glonass module, a Beidou module, or a Galileo module), an NFC module 1025, an MST module 1026, and a radio frequency (RF) module 1027.

The cellular module 1021 may provide a voice call, a video call, a text message service, or an Internet service through a communication network. The cellular module 1021 may distinguish between and authenticate electronic device 1001 within a communication network using the SIM 1029. The cellular module 1021 may perform at least some of the functions that the processor 1010 may provide. The cellular module 1021 may include a CP.

Each of the Wi-Fi module 1022, the Bluetooth module 1023, the GNSS module 1024, the NFC module 1025, or the MST module 1026 may include a processor for processing data transmitted/received through the corresponding module. At least some of the cellular module 1021, the Wi-Fi module 1022, the Bluetooth module 1023, the GNSS module 1024, the NFC module 1025, and the MST module 1026 may be included in one integrated chip (IC) or IC package.

The RF module 1027 may transmit/receive a communication signal (e.g., an RF signal). The RF module 1027 may include a transceiver, a power amp module (PAM), a frequency filter, a low noise amplifier (LNA), or an antenna. At least one of the cellular module 1021, the Wi-Fi module 1022, the Bluetooth module 1023, the GNSS module 1024, the NFC module 1025, or the MST module 1026 may transmit and receive an RF signal through a separate RF module.

The SIM 1029 may include a card including a subscriber identification module and/or an embedded SIM, and may further include unique identification information (e.g., an integrated circuit card identifier (ICCID)) or subscriber information (e.g., international mobile subscriber identity (IMSI)).

The memory 1030 may include an internal memory 1032 or an external memory 1034. The internal memory 1032 may include at least one of a volatile memory (e.g., a dynamic random access memory (DRAM), a static RAM (SRAM), a synchronous dynamic RAM (SDRAM), and the like) and a non-volatile memory (e.g., a one-time programmable read only memory (OTPROM), a programmable ROM (PROM), an erasable and programmable ROM (EPROM), an electrically erasable and programmable ROM (EEPROM), a flash memory (e.g., a NAND flash memory or a NOR flash memory), a hard drive, or a solid state drive (SSD)).

The external memory 1034 may further include a flash drive a compact flash (CF), a secure digital (SD), a micro secure digital (Micro-SD), a mini secure digital (Mini-SD), an extreme digital (xD), a memory stick, or the like. The external memory 1034 may be functionally and/or physically connected to the electronic device 1001 through various interfaces.

The security module 1036 is a module including a storage space having a relatively high security level as compared with the memory 1030, and may be a circuit that guarantees safe data storage and a protected execution environment. The security module 1036 may be implemented by a separate circuit, and may include a separate processor. The security module 1036 may be present in a detachable smart chip or a secure digital (SD) card, or may include an embedded secure element (eSE) embedded in a fixed chip of the electronic device 1001. Further, the security module 1036 may be driven by an OS that is different from the operating system of the electronic device 1001. For example, the security module 1036 may be operated based on a java card open platform (JCOP) operating system.

The sensor module 1040 may measure a physical quantity or detect an operational state of the electronic device 1001, and may convert the measured or detected information to an electrical signal. The sensor module 1040 may include at least one of a gesture sensor 1040A, a gyro sensor 1040B, an atmospheric pressure sensor 1040C, a magnetic sensor 1040D, an acceleration sensor 1040E, a grip sensor 1040F, a proximity sensor 1040G, a red, green, blue (RGB) sensor 1040H, a biometric sensor 1040I, a temperature/humidity sensor 1040J, a illumination sensor 1040K, and an ultraviolet (UV) sensor 1040M. Additionally or alternatively, the sensor module 1040 may include an E-nose sensor, an electromyography (EMG) sensor, an electroencephalogram (EEG) sensor, an electrocardiogram (ECG) sensor, an infrared (IR) sensor, an iris sensor, and/or a fingerprint sensor. The sensor module 1040 may further include a control circuit for controlling one or more sensors included in the sensor module 1040. The electronic device 1001 may further include a processor configured to control the sensor module 1040 as a part of or separately from the processor 1010, and may control the sensor module 1040 while the processor 1010 is in a sleep state.

The input device 1050 may include a touch panel 1052, a (digital) pen sensor 1054, a key 1056, and an ultrasonic input device 1058.

The touch panel 1052 may use at least one of a capacitive type, a resistive type, an infrared type, and an ultrasonic type. The touch panel 1052 may further include a control circuit. The touch panel 1052 may further include a tactile layer, and provide a tactile reaction to a user.

The (digital) pen sensor 1054 may include a recognition sheet which is a part of the touch panel or a separate recognition sheet.

The key 1056 may include a physical button, an optical key, or a keypad.

The ultrasonic input device 1058 may detect ultrasonic waves generated by an input tool through a microphone 1088 and may identify data corresponding to the detected ultrasonic waves.

The display 1060 may include a panel 1062, a hologram device 1064, and a projector 1066.

The panel 1062 may be implemented to be, for example, flexible, transparent, or wearable. The panel 1062 may be formed together with the touch panel 1052 as a single module. The panel 1062 may include a pressure sensor (or a force sensor) that may measure the strength of a pressure of a touch of the user. The pressure sensor may be implemented integrally with the touch panel 1062 or may be implemented by one or more sensors that are separate from the touch panel 1062.

The hologram device 1064 may display a three dimensional image in the air using an interference of light.

The projector 1066 may display an image by projecting light onto a screen. The screen may be located in the interior of or on the exterior of the electronic device 1001.

The display 1060 may further include a control circuit for controlling the panel 1062, the hologram device 1064, or the projector 1066.

The interface 1070 may include a high-definition multimedia interface (HDMI) 1072, a USB 1074, an optical interface 1076, or a D-subminiature (D-sub) 1078. Additionally or alternatively, the interface 1070 may include a mobile high-definition link (MHL) interface, a SD card/multimedia card (MMC) interface, or an infrared data association (IrDA) standard interface.

The audio module 1080 may bilaterally convert a sound and an electrical signal. The audio module 1080 may process sound information input or output through a speaker 1082, a receiver 1084, an earphone 1086, or the microphone 1088.

The camera module 1091 is a device which may photograph a still image and a dynamic image. The camera module 291 may include one or more image sensors (e.g., a front sensor or a back sensor), a lens, an ISP or a flash (e.g., an LED or xenon lamp).

The power management module 1095 may manage power of the electronic device 1001. The power management module 1095 may include a power management integrated circuit (PMIC), a charger integrated circuit (IC), or a battery gauge. The PMIC may have a wired and/or wireless charging scheme. Examples of the wireless charging method may include a magnetic resonance method, a magnetic induction method, an electromagnetic wave method, and the like. Additional circuits (for example, a coil loop, a resonance circuit, a rectifier, etc.) for wireless charging may be further included. The battery gauge may measure a residual quantity, a voltage, a current, or a temperature of the battery 1096. The battery 1096 may include a rechargeable battery and/or a solar battery.

The indicator 1097 may indicate a particular status of the electronic device 1001 or a part thereof (e.g., the processor 1010), for example, a booting status, a message status, a charging status, or the like.

The motor 1098 may convert an electrical signal into mechanical vibrations, and may generate a vibration or haptic effect.

The electronic device 1001 may include a processing unit (e.g., a GPU) for supporting mobile TV. The processing unit for supporting mobile TV may process media data pursuant to a certain standard, such as digital multimedia broadcasting (DMB), digital video broadcasting (DVB), or MediaFLO™.

Each of the elements described in the specification may include one or more components, and the terms of the elements may be changed according to the type of the electronic device. The electronic device may include at least one of the elements described in the specification, and some elements may be omitted or additional elements may be further included. Some of the elements of the electronic device may be coupled to form one entity, and may perform the same functions of the corresponding elements before they are coupled.

Figure 11:
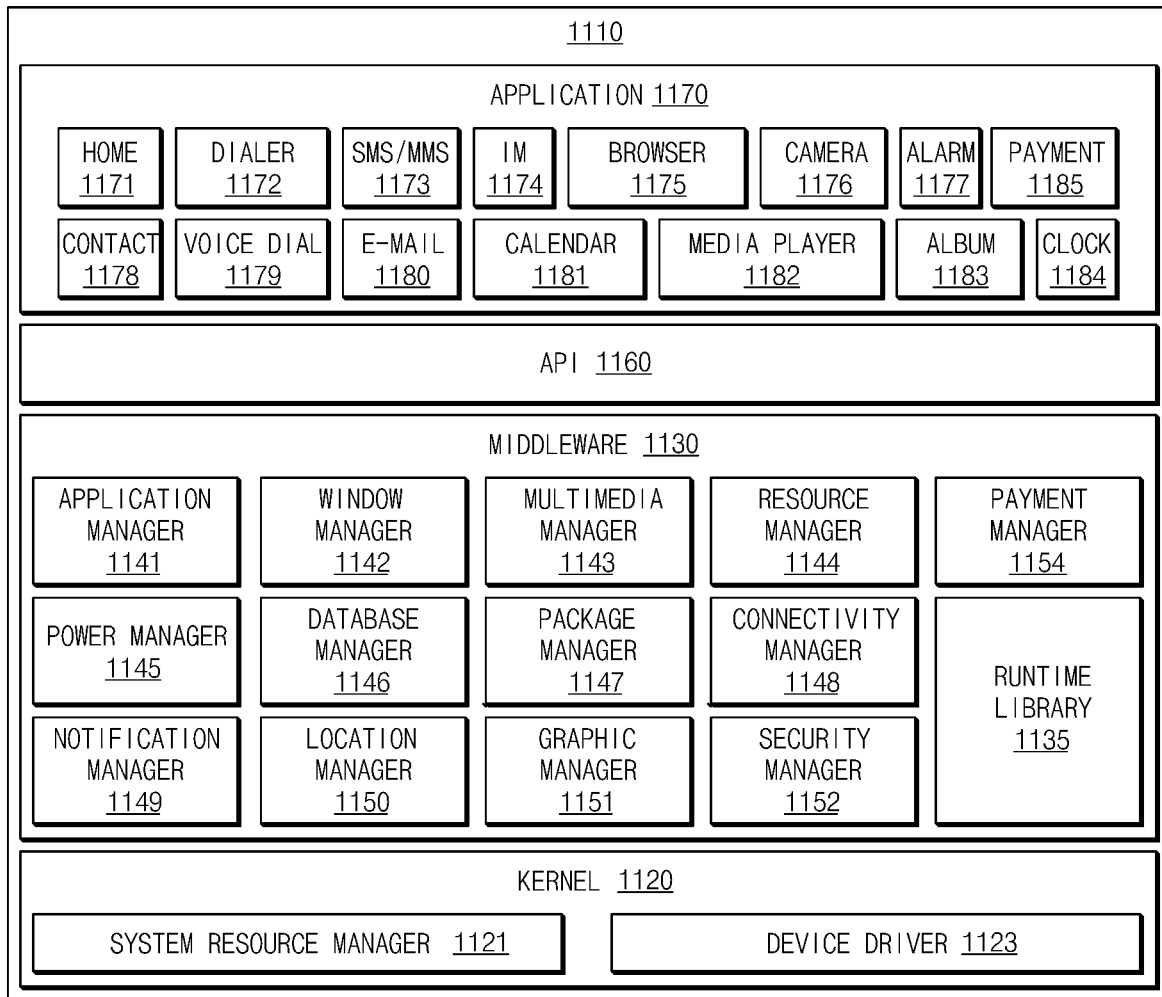
FIG. 11 illustrates a block diagram of a program module of an electronic device, according to an embodiment of the present disclosure.

FIG. 11 illustrates a block diagram of a program module of an electronic device, according to an embodiment of the present disclosure.

Referring to FIG. 11, a program module 1110 is provided. The programming module 110 may include an operating system (OS) that controls resources related to the electronic device 901, and an application program 947 that is driven on an operating system. The operating system may be Android™, iOS™, Windows™, Symbian™, Tizen™, Bala™, or the like.

The program module 1110 includes a kernel 1120, a middleware 1130, an API 1160, or applications 1170. At least a part of the program module 1110 may be preloaded on the electronic device 901 or may be downloaded from the first and second external electronic devices 902 and 904 and the server 906.

The kernel 1120 includes a system resource manager 1121, or a device driver 1123. The system resource manager 1121 may control, allocate, or retrieve the system resources. The system resource manager 1121 may include a process management unit, a memory management unit, or a file system management unit. The device driver 1123 may include a display driver, a camera driver, a Bluetooth driver, a shared-memory driver, a USB driver, a keypad driver, a Wi-Fi driver, an audio driver, or an inter-process communication (IPC) driver.

The middleware 1130 may provide a common function required by the application 1170 or provide various functions to the application 1170 through the API 1160 so that the application 1170 can efficiently use limited system resources of the electronic device 901. The middleware 1130 includes at least one of a runtime library 1135, an application manager 1141, a window manager 1142, a multimedia manager 1143, a resource manager 1144, a power manager 1145, a database manager 1146, a package manager 1147, a connectivity manager 1148, a notification manager 1149, a location manager 1150, a graphic manager 1151, a security manager 1152, and a payment manager 1154.

The run time library 1135 may include a library module that a compiler uses in order to add new functions through a programming language while the application 1170 is executed. The run time library 1135 may perform input/output management, memory management, or a function for an arithmetic function.

The application manager 1141 may manage a lifecycle of the application 1170.

The window manager 1142 may manage a GUI resource used in a screen.

The multimedia manager 1143 may detect a format required for reproducing various media files and encode or decode a media file using a codec appropriate for the corresponding format.

The resource manager 1144 may manage resources, such as a source code, a memory, or a storage space, of the application 1170.

The power manager 1145 may operate together with a basic input/output system (BIOS), so as to manage a battery or power and may provide power information required for the operation of the electronic device 901.

The database manager 1146 may generate, search for, or change a database to be used by the applications 1170.

The package manager 1147 may manage the installation or the updating of applications distributed in a package file form.

The connectivity manager 1148 may manage wireless connections, such as Wi-Fi or Bluetooth.

The notification manager 1149 may display or notify an event, such as a received message, an appointment, a proximity notification, and the like, to a user without disturbing the user.

The location manager 1150 may manage location information of the electronic device 901.

The graphic manager 1151 may manage graphic effects to be provided to a user and user interfaces related to the graphic effects.

The security manager 1152 may provide various security functions required for system security or user authentication.

When the electronic device 901 has a phone function, the middleware 1130 may further include a telephony manager for managing a voice or video communication function of the electronic device.

The middleware 1130 may include a middleware module for forming a combination of various functions of the aforementioned components. The middleware 1130 may provide modules specialized according to the type of OS in order to provide differentiated functions. In addition, some existing components may be dynamically removed from the middleware 1130, or new components may be added to the middleware 230.

The API 1160 is a set of API programming functions, and may be provided another configuration according to an operating system. For example, for each platform, one API set may be provided in a case of Android™ or iOS™, and two or more API sets may be provided in a case of Tizen™.

The application 1170 may include a home 1171, a dialer 1172, an SMS/MMS 1173, an instant message (IM) 1174, a browser 1175, a camera 1176, an alarm 1177, a contact 1178, a sound dial 1179, an e-mail 1180, a calendar 1181, a media player 1182, an album 1183, a clock 1184, and payment 1185 application. The applications 1170 may additionally include at least one application that may provide health care information (e.g., measuring an exercise degree or blood glycose level) or environmental information.

The application 1170 may include an information exchange application that supports exchange of information between the electronic device 901 and the first and second external electronic device 902 and 904. The information exchange application may include a notification relay application for forwarding specific information to an external electronic device, or a device management application for managing an external electronic device.

The notification relay application may have a function of forwarding, to external electronic devices (e.g., the first and second electronic devices 902 and 904), notification information generated from other applications of the electronic device 901 (e.g., an SMS/MMS application, an e-mail application, a health care application, and an environmental information application). The notification relay application may receive notification information from an external electronic device and provide the received notification information to a user.

The device management application may manage (e.g., install, delete, or update) a function for at least a part of an external electronic device (e.g., the first and second external electronic device 902 or 904) communicating with the electronic device 901 (e.g., activating/deactivating the external electronic device itself (or some components thereof) or adjusting the brightness (or resolution) of a display), an application operating in the external electronic device, or a service provided from the external electronic device (e.g., a telephone call service or a message service).

The applications 1170 may include an application (e.g., a health management application) designated according to an attribute of an external electronic device (e.g., the external electronic device 902 or 904). The applications 1170 may include an application that is received from an external electronic device (e.g., the server 906 or the external electronic device 902 or 904). The applications 1170 may include a preloaded application or a third party application that is downloaded from the server 906.

The names of the elements of the program module 1110 according to the illustrated embodiment may vary according to the type of the operating system.

At least a part of the program module 1110 may be implemented by software, firmware, hardware, or a combination thereof. At least a part of the program module 1110 may be implemented (e.g., executed) by the processor 1010. At least a part of the program module 1110 may include a module, a program routine, a set of instructions, or a process for performing at least one function.

The term "module" used herein may refer to a unit including, for example, one of hardware, software, or firmware or a combination thereof. The term "module" may be interchangeably used with the term "unit", "logic", a "logical block", a "component", or a "circuit". The module may be a minimum unit or a part of an integrally configured part. The module may be a part which performs one or more functions. The module may be implemented mechanically or electromagnetically. For example, the module may include at least one of an application-specific integrated circuit (ASIC) chip, a field-programmable gate array, or a programmable-logic device, which has been known, will be developed in the future, or performs certain operations.

An electronic device according to an embodiment may include a circuit board, a first conductive member electrically connected to the circuit board at a first point, a second conductive member electrically connected to the circuit board at a second point, and a connection member connecting the first conductive member and the second conductive member, and the connection member may include a first conductive layer electrically connected to the first conductive member, a second conductive layer electrically connected to the second conductive member, and a dielectric layer interposed between the first conductive layer and the second conductive layer.

The electronic device may further include a bracket disposed on or over the circuit board, and the first conductive member is included as at least a portion of the bracket.

The first point may be electrically connected to a ground area of the circuit board.

The electronic device may further include a housing defining an external appearance of the electronic device, and the second conductive member may be included as at least a portion of the housing.

The housing may include a side housing formed of metal, and the second conductive member may be included as at least a portion of the side housing.

The electronic device may further include an antenna radiator configured to transmit and receive a signal of a specific frequency, and the second conductive member may define at least a portion of the antenna radiator.

The electronic device may further include a wireless communication circuit disposed in the circuit board, and the wireless communication circuit may feed electric power to the second conductive member through the second point.

The connection member may further include a conductive part coupled to a portion of a surface of the second conductive layer, and the second conductive layer may be electrically connected to the second conductive member through the conductive part.

The conductive part may include a C-clip, a conductive elastomer, or a conductive tape.

The connection member may further include an insulation layer disposed on a surface of the second conductive layer, which the conductive part does not contact.

The first conductive layer and the second conductive layer may have at least one bending portion, and the dielectric layer may be divided into a plurality of layers by the at least one bending portion.

The dielectric layer may have a permittivity of not less than a specific value.

The capacitance component formed by the first conductive layer, the dielectric layer, and the second conductive layer of the connection member may cut off a signal of not more than a frequency.

An electronic device according to an embodiment may include a circuit board, a conductive member, and a connection member connecting the circuit board and the conductive member, and the connection member may include a first conductive layer electrically connected to the circuit board, a second conductive layer electrically connected to the conductive member, and a dielectric layer interposed between the first conductive layer and the second conductive layer.

The first conductive layer may be electrically connected to a ground area of the circuit board.

The connection member may further include a conductive part coupled to a portion of a surface of the second conductive layer, and the second conductive layer may be electrically connected to the conductive member through the conductive part.

The conductive part may include a C-clip, a conductive elastomer, or a conductive tape.

The connection member may further include an insulation layer disposed on a surface of the second conductive layer, which the conductive part does not contact.

The dielectric layer may have a permittivity of not less than a specific value.

A capacitance component formed by the first conductive layer, the dielectric layer, and the second conductive layer of the connection member may cut off a signal of a frequency or lower.

At least some of the devices (e.g., modules or functions) or methods (e.g., operations) according to various embodiments of the present disclosure may be implemented by an instruction stored in a computer-readable storage medium in the form of a program module. When the instruction is executed by a processor the processor may perform a function corresponding to the instruction. The computer-readable storage medium may be a memory 930.

The computer-readable storage medium may include a hard disk, a floppy disk, a magnetic medium (e.g., a magnetic tape), an optical medium (e.g., a CD-ROM), a DVD, a magneto-optical medium (e.g., a floptical disk), a hardware device (e.g., a read only memory (ROM), a random access memory (RAM), or a flash memory). Further, the instruction may include high-level language codes which may be executed by a computer using an interpreter as well as machine languages created by using a compiler.

The above-mentioned hardware device may be configured to be operated as one or more software module to perform operations, and the converse is true.

The module or program module of the present disclosure may include at least one of the above-mentioned element, omit some of them, or further include other elements. The module, the program module, or the operations performed by other elements of the present disclosure may be performed in a sequential, parallel, iterative, or heuristic method. Further, some operations may be executed in another sequence or may be omitted, or other operations may be added.

The embodiments disclosed are provided to describe the technical contents and for understanding of the technical contents. Accordingly, while the present disclosure has been shown and described with reference to various embodiments, it should be understood by those skilled in the art that various changes in form and detail may be made without departing from the spirit and scope of the present disclosure, which is defined, not by the detailed description and embodiments, but by the appended claims and their equivalents.

What is claimed is:
1. An electronic device comprising:
a circuit board;

a first conductive member electrically connected to the circuit board at a first point;
a second conductive member electrically connected to the circuit board at a second point; and
a connection member connecting the first conductive member and the second conductive member,
wherein the connection member comprises:
    a first conductive layer electrically connected to the first conductive member,
    a second conductive layer electrically connected to the second conductive member, and
    a dielectric layer disposed between the first conductive layer and the second conductive layer,
wherein the dielectric layer has a permittivity greater than or equal to a specific value, and
wherein a capacitance component formed by the first conductive layer, the dielectric layer, and the second conductive layer of the connection member cuts off a signal having a frequency less than or equal to a specific frequency.

2. The electronic device of claim 1, further comprising:
a bracket disposed on or over the circuit board,
wherein the first conductive member is at least a portion of the bracket.

3. The electronic device of claim 1, wherein the first point is electrically connected to a ground area of the circuit board.

4. The electronic device of claim 1, further comprising:
a housing,
wherein the second conductive member is at least a portion of the housing.

5. The electronic device of claim 4, wherein the housing comprises a side housing formed of metal, and
wherein the second conductive member is at least a portion of the side housing.

6. The electronic device of claim 1, further comprising:
an antenna radiator configured to transmit and receive a signal,
wherein the second conductive member is at least a portion of the antenna radiator.

7. The electronic device of claim 6, further comprising:
a wireless communication circuit disposed in the circuit board,
wherein the wireless communication circuit feeds electric power to the second conductive member through the second point.

8. The electronic device of claim 1, wherein the connection member further comprises a conductive part coupled to a portion of a surface of the second conductive layer, and
wherein the second conductive layer is electrically connected to the second conductive member through the conductive part.

9. The electronic device of claim 8, wherein the conductive part comprises a C-clip, a conductive elastomer, or a conductive tape.

10. The electronic device of claim 8, wherein the connection member further comprises an insulation layer disposed on a surface of the second conductive layer that the conductive part does not contact.

11. The electronic device of claim 1, wherein the first conductive layer and the second conductive layer have at least one bending portion, and
wherein the dielectric layer is divided into a plurality of layers by the at least one bending portion.

12. An electronic device comprising:
a circuit board;
a conductive member; and
a connection member connecting the circuit board and the conductive member,
wherein the connection member comprises:
    a first conductive layer electrically connected to the circuit board;
    a second conductive layer electrically connected to the conductive member; and
    a dielectric layer disposed between the first conductive layer and the second conductive layer,
wherein the dielectric layer has a permittivity greater than or equal to a specific value, and
wherein a capacitance component formed by the first conductive layer, the dielectric layer, and the second conductive layer of the connection member cuts off a signal having a frequency less than or equal to a specific frequency.

13. The electronic device of claim 12, wherein the first conductive layer is electrically connected to a ground area of the circuit board.

14. The electronic device of claim 12, wherein the connection member further comprises a conductive part coupled to a portion of a surface of the second conductive layer, and
wherein the second conductive layer is electrically connected to the conductive member through the conductive part.

15. The electronic device of claim 14, wherein the conductive part comprises a C-clip, a conductive elastomer, or a conductive tape.

16. The electronic device of claim 14, wherein the connection member further comprises an insulation layer disposed on a surface of the second conductive layer that the conductive part does not contact.

* * * * *